(12) United States Patent
Wada et al.

(10) Patent No.: US 11,898,246 B2
(45) Date of Patent: Feb. 13, 2024

(54) VAPOR DEPOSITION DEVICE

(71) Applicant: SUMCO CORPORATION, Tokyo (JP)

(72) Inventors: Naoyuki Wada, Tokyo (JP); Yu Minamide, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 345 days.

(21) Appl. No.: 17/415,410

(22) PCT Filed: Nov. 5, 2019

(86) PCT No.: PCT/JP2019/043259
§ 371 (c)(1),
(2) Date: Jun. 17, 2021

(87) PCT Pub. No.: WO2020/137169
PCT Pub. Date: Jul. 2, 2020

(65) Prior Publication Data
US 2022/0056581 A1 Feb. 24, 2022

(30) Foreign Application Priority Data

Dec. 27, 2018 (JP) ................................ 2018-244822

(51) Int. Cl.
*H01L 21/67* (2006.01)
*C23C 16/458* (2006.01)
(Continued)

(52) U.S. Cl.
CPC ...... *C23C 16/458* (2013.01); *H01L 21/67201* (2013.01); *H01L 21/67742* (2013.01); *H01L 21/68707* (2013.01); *H01L 21/68742* (2013.01)

(58) Field of Classification Search
None
See application file for complete search history.

(56) References Cited

U.S. PATENT DOCUMENTS

2006/0102078 A1* 5/2006 Fairbairn .......... H01L 21/67745
156/345.32
2006/0102285 A1 5/2006 Bluck et al.
(Continued)

FOREIGN PATENT DOCUMENTS

| JP | H11-102952 A | 4/1999 |
|---|---|---|
| JP | 2008-520837 A | 6/2006 |

(Continued)

OTHER PUBLICATIONS

Office Action issued in Korean Patent Application No. 10-2021-7022087, dated Jan. 27, 2023, together with an English-language translation.
(Continued)

*Primary Examiner* — Cory W Eskridge
(74) *Attorney, Agent, or Firm* — GREENBLUM & BERNSTEIN, P.L.C.

(57) ABSTRACT

A vapor deposition device is provided that can ameliorate or improve the LPD quality. A vapor deposition device includes a first holder that supports a carrier at a topmost-level and a second holder that supports the carrier under the first holder in a load-lock chamber, and a second robot mounts a before-treatment wafer extracted from a wafer storage container on the carrier standing by at the first holder in the load-lock chamber.

9 Claims, 10 Drawing Sheets

(51) Int. Cl.
*H01L 21/677* (2006.01)
*H01L 21/687* (2006.01)

(56) References Cited

U.S. PATENT DOCUMENTS

| | | |
|---|---|---|
| 2007/0207014 A1 | 9/2007 | Toshima |
| 2009/0252582 A1 | 10/2009 | Bluck et al. |
| 2011/0132255 A1 | 6/2011 | Kinbara et al. |
| 2012/0093616 A1 | 4/2012 | Bluck et al. |
| 2012/0213615 A1* | 8/2012 | Sakaue ............ H01L 21/67745 |
| | | 414/217 |
| 2012/0247671 A1* | 10/2012 | Sugawara ......... H01J 37/32642 |
| | | 156/345.31 |
| 2014/0216658 A1 | 8/2014 | Minami et al. |
| 2017/0067181 A1 | 3/2017 | Wada |
| 2017/0110352 A1 | 4/2017 | Tobin |

FOREIGN PATENT DOCUMENTS

| | | |
|---|---|---|
| JP | 2007-242648 A | 9/2007 |
| JP | 2018-536986 A | 12/2018 |
| KR | 10-2014-0041820 A | 12/2018 |

OTHER PUBLICATIONS

U.S. Appl. No. 17/415,838 to Naoyuki Wada et al., which was filed on Jun. 18, 2021.
U.S. Appl. No. 17/417,650 to Naoyuki Wada et al., which was filed on Jun. 23, 2021.
Search Report issued in International Bureau of WIPO Patent Application No. PCT/JP2019/043259, dated Jan. 28, 2020.

\* cited by examiner

VAPOR DEPOSITION DEVICE

FIELD OF THE INVENTION

The present invention relates to a vapor deposition device used in manufacturing epitaxial wafers for example.

BACKGROUND OF THE INVENTION

In order to keep damage to a reverse face of a silicon wafer to a minimum in vapor deposition devices used in manufacturing epitaxial wafers, for example, transporting the silicon wafer through steps from a load-lock chamber to a reaction chamber in a state where the silicon wafer is mounted on a ring-shaped carrier has been proposed (Patent Literature 1).

In this type of vapor deposition device, whereas a before-treatment wafer is mounted on a ring-shaped carrier standing by in the load-lock chamber, an after-treatment wafer is transported from the reaction chamber to the load-lock chamber still mounted on a ring-shaped carrier.

RELATED ART

Patent Literature

Patent Literature 1: U.S. Patent Application No. 2017/0110352

SUMMARY OF THE INVENTION

Problems to be Solved by the Invention

In the load-lock chamber, it is necessary to handle the before-treatment wafer and the after-treatment wafer, thus in order to save space and improve productivity, it is conceivable to configure the load-lock chamber in multiple stages. However, since the ring-shaped carrier transferred into the load-lock chamber is transferred via the reaction chamber, it becomes a factor of generating particles, and there is a problem that LPD (Light Point Defect) quality deteriorates.

The present invention undertakes to solve the issue of providing a vapor deposition device that can ameliorate or improve the LPD quality.

Means for Solving the Problems

The present invention is a vapor deposition device which is provided with a ring-shaped carrier that supports an outer edge of a wafer, and which uses a plurality of the carriers to:

transport a plurality of before-treatment wafers from a wafer storage container, through a factory interface, load-lock chamber, and wafer transfer chamber, to a reaction chamber in that order, and transport a plurality of after-treatment wafers from the reaction chamber, through the wafer transfer chamber, load-lock chamber, and factory interface, to the wafer storage container in that order, and in which the load-lock chamber communicates with the factory interface via a first door and also communicates with the wafer transfer chamber via a second door, the wafer transfer chamber communicates, via a gate valve, with the reaction chamber in which a CVD film is formed on the wafer, the wafer transfer chamber is provided with a first robot that deposits a before-treatment wafer transported into the load-lock chamber into the reaction chamber in a state where the before-treatment wafer is mounted on a carrier and also withdraws an after-treatment wafer for which treatment in the reaction chamber has ended from the reaction chamber in a state where the after-treatment wafer is mounted on a carrier and transports the wafer to the load-lock chamber, the factory interface is provided with a second robot that extracts a before-treatment wafer from the wafer storage container and mounts the wafer on a carrier standing by in the load-lock chamber, and also stores in the wafer storage container an after-treatment wafer mounted on the carrier that has been transported to the load-lock chamber, and the load-lock chamber is provided with a first holder that supports the carrier at a topmost-level and a second holder that supports the carrier under the first holder, wherein the second robot mounts the before-treatment wafer extracted from the wafer storage container on the carrier standing by at the first holder in the load-lock chamber.

More preferably, in the present invention, the first robot transfers the carrier supported by the second holder to the first holder when the first holder supports no carrier upon the first robot mounting the before-treatment wafer extracted from the wafer storage container by the second robot on the carrier standing by in the load-lock chamber.

More preferably, in the present invention, the first robot withdraws the after-treatment wafer for which the treatment in the reaction chamber has ended from the reaction chamber in the state where the after-treatment wafer is mounted on the carrier and transports the wafer to the second holder in the load-lock chamber.

More preferably, in the present invention, the load-lock chamber is provided with a third holder that supports the carrier under the second holder.

More preferably, in the present invention, the first robot is provided with a first blade on which the carrier is mounted.

More preferably, in the present invention, the first blade is provided with a recess corresponding to a part of an outer circumferential wall of the carrier surface on an upper face.

More preferably, in the present invention, the second robot is provided with a second blade on which the wafer is mounted.

More preferably, in the present invention, the CVD film is a silicon epitaxial film.

The present invention is A vapor deposition method using a vapor deposition device which is provided with a ring-shaped carrier that supports an outer edge of a wafer, and which uses a plurality of the carriers to:

transport a plurality of before-treatment wafers from a wafer storage container, through a factory interface, load-lock chamber, and wafer transfer chamber, to a reaction chamber in that order, and transport a plurality of after-treatment wafers from the reaction chamber, through the wafer transfer chamber, load-lock chamber, and factory interface, to the wafer storage container in that order, and in which the load-lock chamber communicates with the factory interface via a first door and also communicates with the wafer transfer chamber via a second door, the wafer transfer chamber communicates, via a gate valve, with the reaction chamber in which a CVD film is formed on the wafer, the wafer transfer chamber is provided with a first robot that deposits a before-treatment wafer transported into the load-lock chamber into the reaction chamber in a state where the before-treatment wafer is mounted on a carrier and also withdraws an after-treatment wafer for which treatment in the reaction chamber has ended from the reaction chamber in a state where the after-treatment wafer is mounted on a carrier and transports the wafer to the load-lock chamber, the factory interface is provided with a second robot that extracts a before-treatment wafer from the wafer storage container and mounts the wafer on a carrier standing by in the load-lock chamber, and also stores in the wafer storage container an after-treatment wafer mounted on the carrier that has been transported to the load-lock chamber, and the load-lock chamber is provided with a first holder that supports the carrier at a topmost-level and a second holder that supports the carrier under the first holder, wherein the second robot mounts the before-treatment wafer extracted from the wafer storage container on the carrier standing by at the first holder in the load-lock chamber, and the first robot transfers the carrier supported by the second holder to the first holder when the first holder supports no carrier upon the first robot mounting the before-treatment wafer extracted from the wafer storage container by the second robot on the carrier standing by in the load-lock chamber.

Effect of the Invention

According to the present invention, the second robot mounts the before-treatment wafer extracted from the wafer storage container on the carrier standing by at the first holder at the topmost-level in the load-lock chamber, and therefore there is no carrier upper the before-treatment wafer. As a result, particles originating from the carrier can be inhibited from adhering to the wafer and LPD quality can be improved.

MODE FOR CARRYING OUT THE INVENTION

Figure 1:
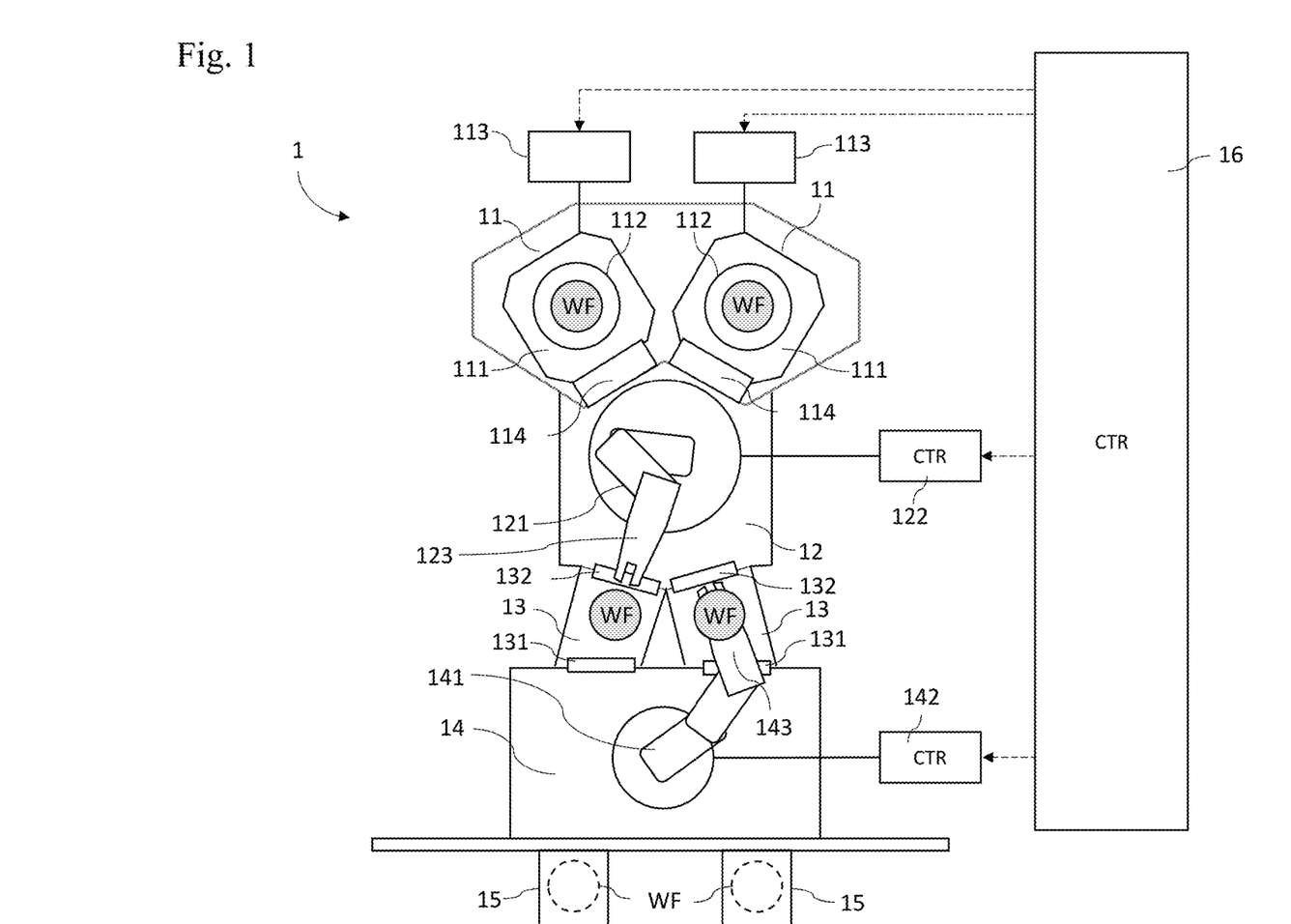
FIG. 1 is a block diagram illustrating a vapor deposition device according to an embodiment of the present invention.

Hereafter, an embodiment of the present invention is described based on the drawings. FIG. 1 is a block diagram illustrating a vapor deposition device 1 according to the embodiment of the present invention. A main body of the vapor deposition device 1 shown in the center of the diagram is illustrated in a plan view. The vapor deposition device 1 of the present embodiment is what is known as a CVD device and is provided with a pair of reaction furnaces 11, 11; a wafer transfer chamber 12 in which is installed a first robot 121 that handles a wafer WF, such as a single crystal silicon wafer; a pair of load-lock chambers 13; a factory interface 14 in which is installed a second robot 141 that handles the wafer WF; and a load robot in which is installed a wafer storage container 15 (cassette case) in which a plurality of the wafers WF are stored.

The factory interface 14 is a zone configured to have the same air atmosphere as a clean room in which the wafer storage container 15 is mounted. The factory interface 14 is provided with the second robot 141, which extracts a before-treatment wafer WF that is stored in the wafer storage container 15 and deposits the wafer WF in the load-lock chamber 13, and also stores an after-treatment wafer WF transported to the load-lock chamber 13 in the wafer storage container 15. The second robot 141 is controlled by a second robot controller 142, and a second blade 143 mounted on a distal end of a robot hand displaces along a predetermined trajectory that has been taught in advance.

A first door 131 capable of opening and closing with an airtight seal is provided between the load-lock chamber 13 and the factory interface 14, while a second door 132 similarly capable of opening and closing with an airtight seal is provided between the load-lock chamber 13 and the wafer transfer chamber 12. In addition, the load-lock chamber 13 serves as a space where atmospheric gas exchange takes place between the wafer transfer chamber 12, which is configured to have an inert gas atmosphere, and the factory interface 14, which is configured to have an air atmosphere. Therefore, an exhaust device that evacuates an interior of the load lock chamber 13 to vacuum and a supply device that supplies inert gas to the load-lock chamber 13 are provided.

For example, when a before-treatment wafer WF is transported from the wafer storage container 15 to the wafer transfer chamber 12, in a state where the first door 131 on the factory interface 14 side is closed, the second door 132 on the wafer transfer chamber 12 side is closed, and the load-lock chamber 13 has an inert gas atmosphere, the wafer WF is extracted from the wafer storage container 15 using the second robot 141, the first door 131 on the factory interface 14 side is opened, and the wafer WF is transported to the load-lock chamber 13. Next, after the first door 131 on the factory interface 14 side is closed and the load-lock chamber 13 is restored to an inert gas atmosphere, the second door 132 on the wafer transfer chamber 12 side is opened and the wafer WF is transported to the wafer transfer chamber 12 using the first robot 121.

Conversely, when an after-treatment wafer WF is transported from the wafer transfer chamber 12 to the wafer storage container 15, in a state where the first door 131 on the factory interface 14 side is closed, the second door 132 on the wafer transfer chamber 12 side is closed, and the load-lock chamber 13 has an inert gas atmosphere, the second door 132 on the wafer transfer chamber 12 side is opened and the wafer WF in the wafer transfer chamber 12 is transported to the load-lock chamber 13 using the first robot 121. Next, after the second door 132 on the wafer transfer chamber 12 side is closed and the load-lock chamber 13 is restored to an inert gas atmosphere, the first door 131 on the factory interface 14 side is opened and the wafer WF is transported to the wafer storage container 15 using the second robot 141.

The wafer transfer chamber 12 is configured by a sealed chamber, connected on one side to the load-lock chamber 13 via the second door 132 that is capable of opening and closing and has an airtight seal, and connected on the other side via a gate valve 114 that is capable of opening and closing and has an airtight seal. The first robot 121, which transports the before-treatment wafer WF from the load-lock chamber 13 to the reaction chamber 111 and transports the after-treatment wafer WF from the reaction chamber 111 to the load-lock chamber 13, is installed on the wafer transfer chamber 12. The first robot 121 is controlled by a first robot controller 122, and a first blade 123 mounted on a distal end of a robot hand displaces along an operation trajectory that has been taught in advance.

An integrated controller 16 that integrates control of the entire vapor deposition device 1, the first robot controller 122, and the second robot controller 142 send and receive control signals amongst each other. In addition, when an operation command signal from the integrated controller 16 is sent to the first robot controller 122, the first robot controller 122 controls the operation of the first robot 121, and an operation result of the first robot 121 is sent from the first robot controller 122 to the integrated controller 16. Accordingly, the integrated controller 16 recognizes an operation status of the first robot 121. Similarly, when an operation command signal from the integrated controller 16 is sent to the second robot controller 142, the second robot controller 142 controls the operation of the second robot 141, and an operation result of the second robot 141 is sent from the second robot controller 142 to the integrated controller 16. Accordingly, the integrated controller 16 recognizes an operation status of the second robot 141.

Inert gas is supplied to the wafer transfer chamber 12 from an inert gas supply device not shown in the drawings, and gas in the wafer transfer chamber 12 is cleaned with a scrubber (scrubbing dust collector, precipitator) that is connected to an exhaust port, after which the gas is released outside the system. Although a detailed depiction is omitted, this type of scrubber can use a conventionally known pressurized water scrubber, for example.

The reaction furnace 11 is a device for growing an epitaxial film on a surface of the wafer WF using a CVD method, and includes a reaction chamber 111; a susceptor 112 on which the wafer WF is placed and rotated is provided inside the reaction chamber 111, and a gas supply device 113 is also provided that supplies hydrogen gas and raw material gas for growing a CVD film (when the CVD film is a silicon epitaxial film, the raw material gas may be silicon tetrachloride $SiCl_4$ or trichlorosilane $SiHCl_3$, for example) to the reaction chamber 111. In addition, although omitted from the drawings, a heat lamp for raising the temperature of the wafer WF to a predetermined temperature is provided around the circumference of the reaction chamber 111. Moreover, a gate valve 114 is provided between the reaction chamber 111 and the wafer transfer chamber 12, and airtightness with the wafer transfer chamber 12 of the reaction chamber 111 is ensured by closing the gate valve 114. Various controls, such as driving the susceptor 112 of the reaction furnace 11, supply and stoppage of gas by the gas supply device 113, turning the heat lamp on and off, and opening and closing the gate valve 114, are controlled by a command signal from the integrated controller 16. The vapor deposition device 1 shown in FIG. 1 depicts an example provided with a pair of reaction furnaces 11, 11, but the vapor deposition device 1 may have one reaction furnace 11 or three or more reaction furnaces.

A scrubber (scrubbing mist eliminator) having a similar configuration to that of the wafer transfer chamber 12 is provided to the reaction furnace 11. In other words, hydrogen gas or raw material gas supplied from the gas supply device 113 is cleaned by the scrubber connected to an exhaust port provided to the reaction chamber 111 and is then released outside the system. A conventionally known pressurized water scrubber, for example, can be used for this scrubber, as well.

Figure 2A:
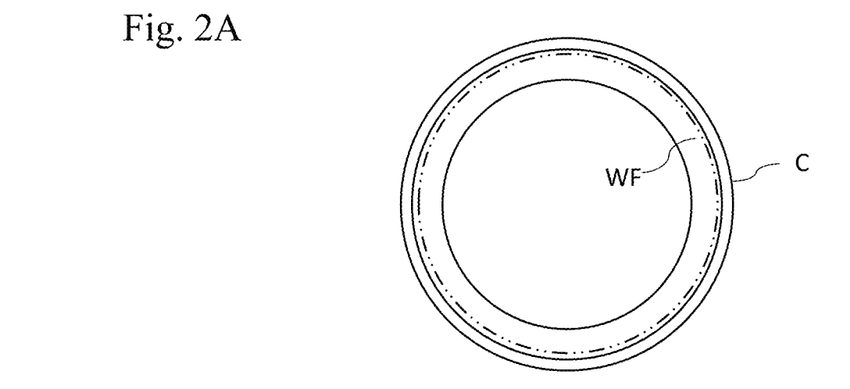
FIG. 2A is a plan view illustrating a carrier according to the embodiment of the present invention.

In the vapor deposition device 1 according to the present embodiment, the wafer WF is transported between the load-lock chamber 13 and the reaction chamber 111 using a ring-shaped carrier C that supports the entire outer circumferential edge of the wafer WF. FIG. 2A is a plan view of the carrier C, FIG. 2B is a cross-sectional view of the carrier C including the wafer WF and the susceptor 112 of the reaction furnace 11, and FIG. 5 is a plan view and cross-sectional views illustrating a transfer protocol for the wafer WF and the carrier C within the reaction chamber 111.

Figure 2B:
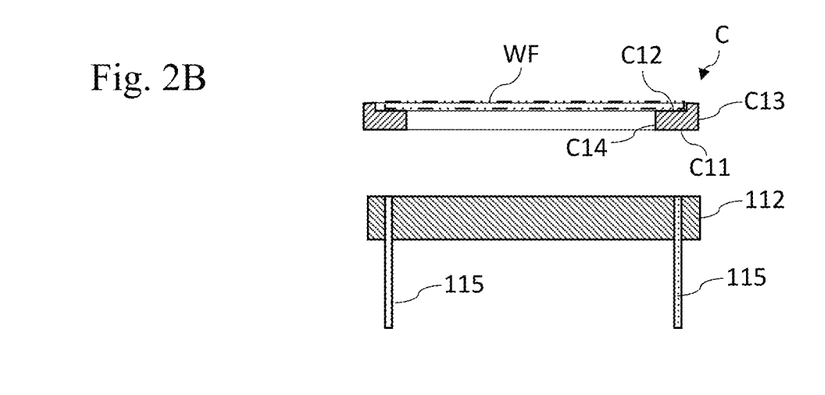
FIG. 2B is a cross-sectional view of the carrier, including a wafer and a reaction furnace susceptor.

The carrier C according to the present embodiment is configured by a material such as SiC, for example, is formed in an endless ring shape; and includes a bottom surface C11 that rests on a top surface of the susceptor 112 shown in FIG. 2B, a top surface C12 that touches and supports the entire outer circumferential edge of a reverse face of the wafer WF, an outer circumferential wall surface C13, and an inner circumferential wall surface C14. In addition, when the wafer WF supported by the carrier C is transported into the reaction chamber 111, in a state where the carrier C rests on the first blade 123 of the first robot 121 as illustrated in the plan view of FIG. 5A, the wafer WF is transported to a top portion of the susceptor 112 as illustrated in FIG. 5B, the carrier C is temporarily lifted by three or more carrier lifting pins 115 provided to the susceptor 112 so as to be capable of displacing vertically as illustrated in FIG. 5C, and the first blade 123 is retracted as illustrated in FIG. 5D, after which the susceptor 112 is raised as illustrated in FIG. 5E, thereby placing the carrier C on the top surface of the susceptor 112.

Figure 5A:
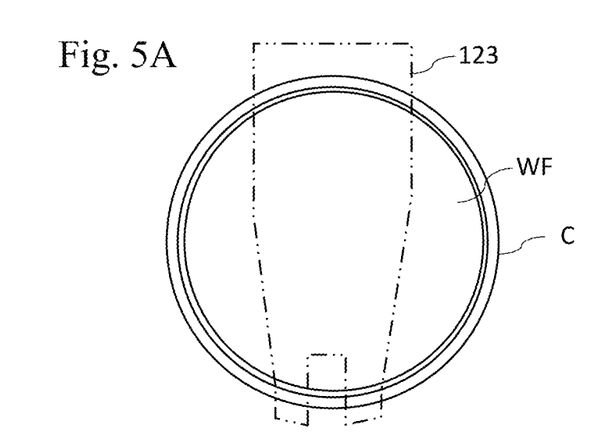
FIGS. 5A-5E are a plan view and cross-sectional views illustrating a transfer protocol for the wafer and the carrier within a reaction chamber.
Figure 5B:
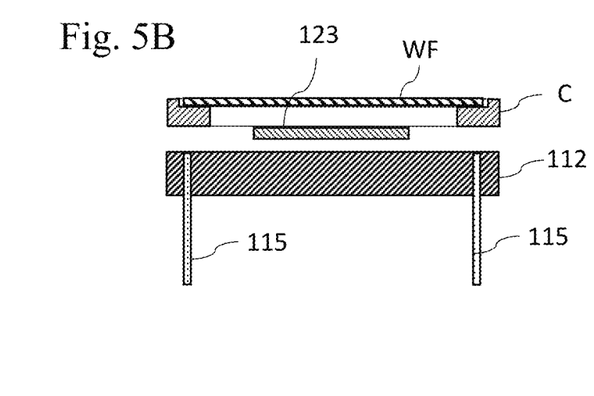
Figure 5C:
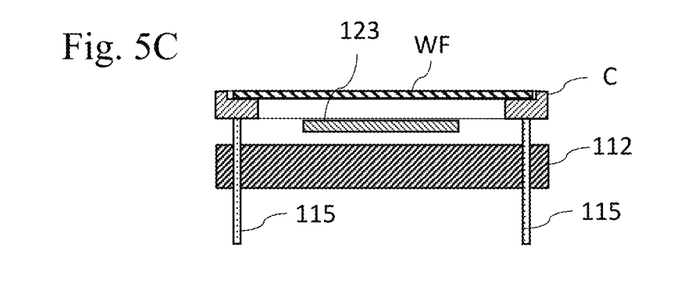
Figure 5D:
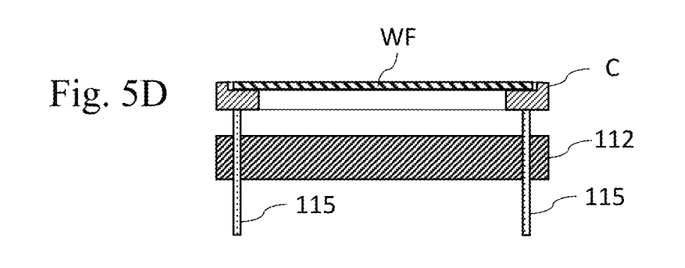
Figure 5E:
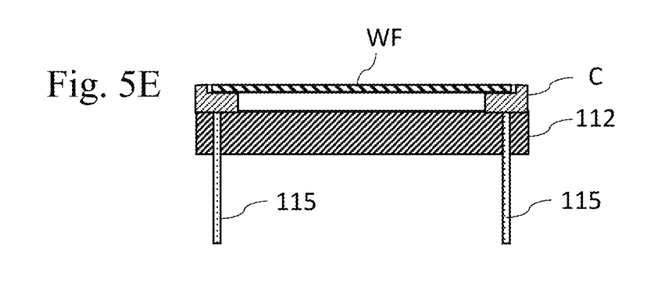

Conversely, when treatment in the reaction chamber 111 has ended for the wafer WF and the wafer WF is withdrawn in a state mounted on the carrier C, the susceptor 112 is lowered from the state illustrated in FIG. 5E and supports the carrier C with only the carrier lifting pins 115 as illustrated in FIG. 5D, the first blade 123 is advanced between the carrier C and the susceptor 112 as illustrated in FIG. 5C, and then the three carrier lifting pins 115 are lowered to rest the carrier C on the first blade 123 as illustrated in FIG. 5B, and the hand of the first robot 121 is operated. In this way, the wafer WF for which treatment has ended can be withdrawn in a state mounted on the carrier C.

Figure 3A:
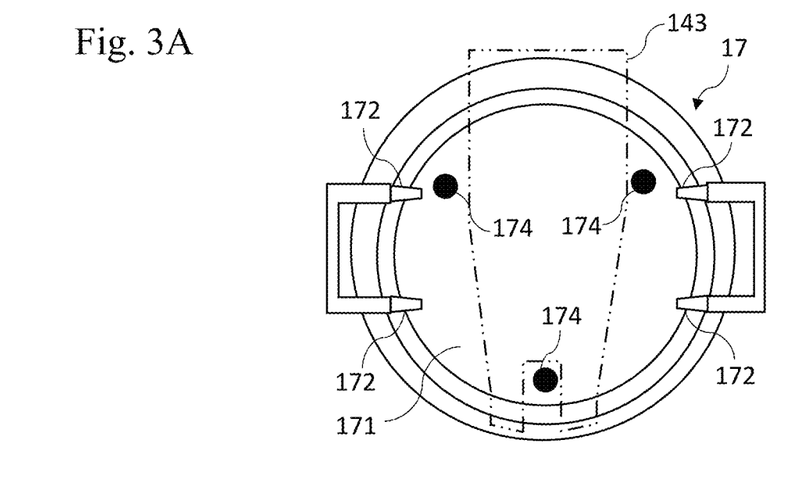
FIG. 3A is a plan view illustrating a holder provided to a load-lock chamber.
Figure 3B:
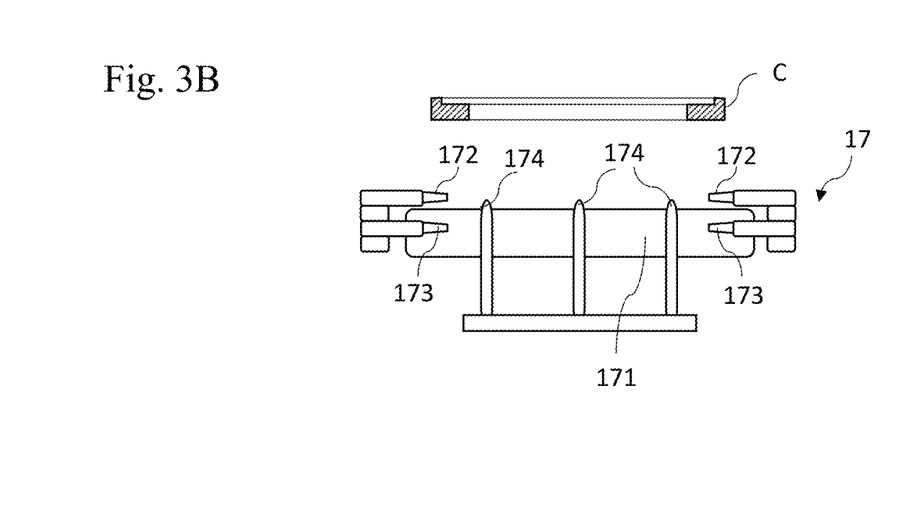
FIG. 3B is a cross-sectional view of the holder including the wafer and the carrier.

Also, in the vapor deposition device 1 according to the present embodiment, the carrier C is transported between processes running from the load-lock chamber 13 to the reaction chamber 111, and therefore in the load-lock chamber 13, the before-treatment wafer WF is placed on the carrier C and the after-treatment wafer WF is removed from the carrier C. Therefore, a holder 17 that supports the carrier C at two vertical levels is provided to the load-lock chamber 13. FIG. 3A is a plan view illustrating the holder 17 that is provided to the load-lock chamber 13, and FIG. 3B is a cross-sectional view of the holder 17 including the carrier C. The holder 17 according to the present embodiment includes a fixed holder base 171; a first holder 172 and second holder 173 that support two carriers C at two vertical levels, and that are provided to the holder base 171 so as to be capable of lifting and lowering vertically; and three wafer lifting pins 174 that are provided to the holder base 171 so as to be capable of lifting and lowering vertically.

The first holder 172 and the second holder 173 (in the plan view of FIG. 3A, the second holder 173 is obscured by the first holder 172 and therefore only the first holder 172 is depicted) have projections for supporting the carrier C at four points, and one carrier C is placed on the first holder 172 and another carrier C is placed on the second holder 173. The carrier C that rests on the second holder 173 is inserted into a gap between the first holder 172 and the second holder 173.

The holder 17 may be further provided with a third holder that supports the carriers under the second holder 173 so as to support the three carriers C in three stages vertically. In this case, each of three carriers C is mounted on each of the first holder 172, the second holder 173 and the third holder. The carrier C mounted on the third holder is inserted into the gap between the second holder 173 and the third holder.

Figure 4A:
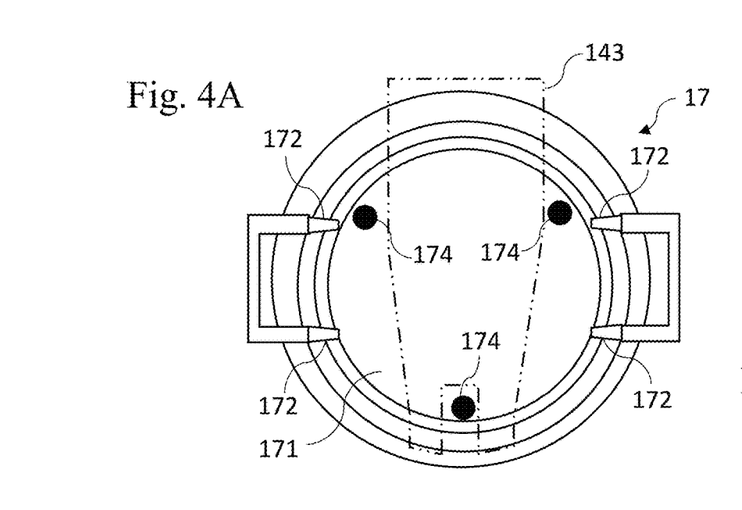
FIGS. 4A-4E are a plan view and cross-sectional views illustrating a transfer protocol for the wafer and the carrier in the load-lock chamber.
Figure 4B:
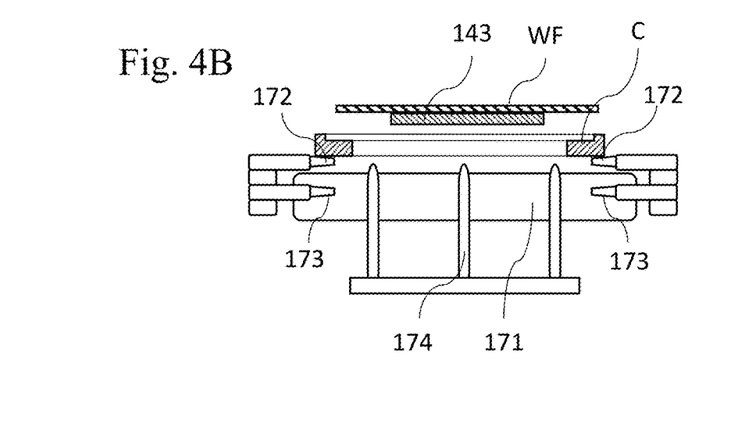

FIG. 4 is a plan view and cross-sectional views of a transfer protocol for the wafer WF and carrier C in the load-lock chamber 13 and depicts a protocol in which a before-treatment wafer WF rests on the carrier C in a state where the carrier C is supported by the first holder 172, as illustrated in FIG. 4B. In other words, the second robot 141 that is provided to the factory interface 14 loads one wafer WF that is stored in the wafer storage container 15 onto the second blade 143 and transports the wafer WF via the first door 131 of the load-lock chamber 13 to a top portion of the holder 17, as illustrated in FIG. 4B. Next, as illustrated in FIG. 4C, the three wafer lifting pins 174 are raised relative to the holder base 171 and temporarily hold up the wafer WF, and the second blade 143 is retracted as illustrated in FIG. 4D. The three wafer lifting pins 174 are provided in positions that do not interfere with the second blade 143, as illustrated in the plan view of FIG. 4A. Next, as illustrated in FIGS. 4D and 4E, the three wafer lifting pins 174 are lowered and the first holder 172 and the second holder 173 are raised, whereby the wafer WF is placed on the carrier C.

Figure 4C:
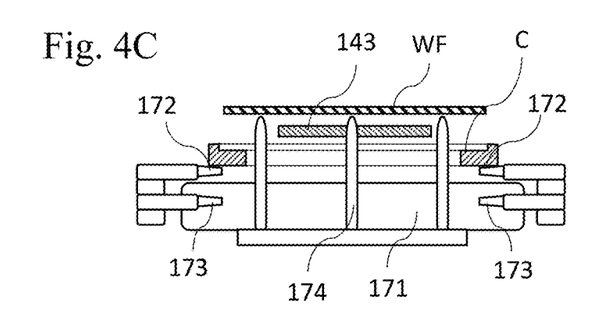
Figure 4D:
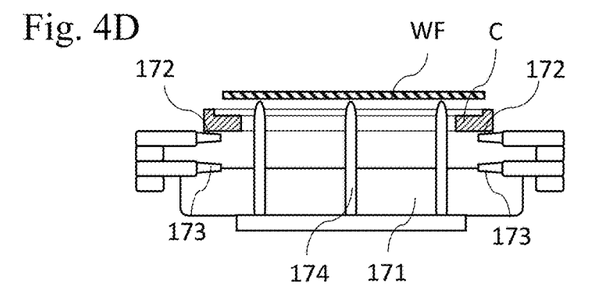
Figure 4E:
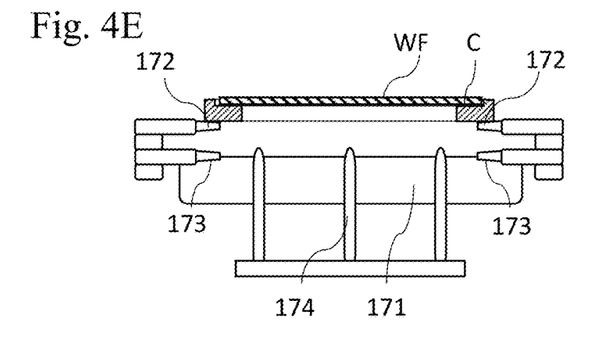

Conversely, when the after-treatment wafer WF transported to the load-lock chamber 13 in a state resting on the carrier C is transported to the wafer storage container 15, as illustrated in FIG. 4D, the three wafer lifting pins 174 are raised and the first holder 172 and the second holder 173 are lowered from the state illustrated in FIG. 4E, the wafer WF is supported by only the wafer lifting pins 174, and the second blade 143 is advanced between the carrier C and the wafer WF as illustrated in FIG. 4C, after which the three wafer lifting pins 174 are lowered to load the wafer WF on the second blade 143 as illustrated in FIG. 4B, and the hand of the second robot 141 is operated. In this way, the wafer WF for which treatment has ended can be taken out of the carrier C and into the wafer storage container 15. In the state illustrated in FIG. 4E, the wafer WF for which treatment has ended is transported to the first holder 172 in a state resting on the carrier C, but the wafer WF can be taken out of the carrier C and into the wafer storage container 15 with a similar protocol when the wafer WF is transported to the second holder 173, as well.

Figure 6A:
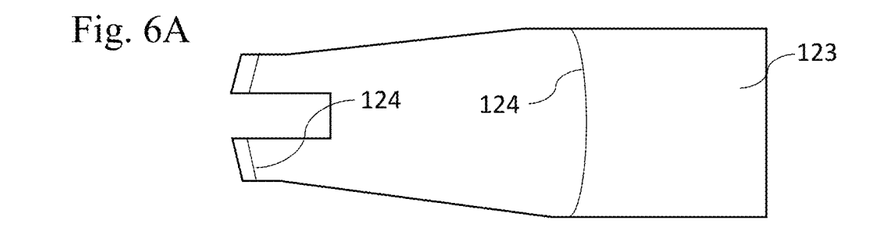
FIG. 6A is a plan view illustrating an example of a first blade attached to the tip of a hand of a first robot.
Figure 6B:
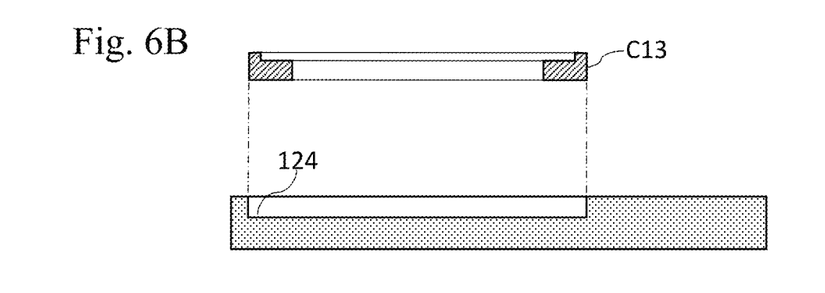
FIG. 6B is a cross-sectional view of the first blade including a carrier.

FIG. 6A is a plan view illustrating an example of a first blade attached to the tip of a hand of a first robot, FIG. 6B is a cross-sectional view of the first blade including a carrier C. The first blade 123 of the present embodiment is provided with a first recess 124 having a diameter corresponding to the outer circumferential wall surface C13 of the carrier C on one surface of a strip plate-shaped main body. The diameter of the first recess 124 is formed to be slightly larger than the diameter of the outer circumferential wall surface C13 of the carrier C. When the first robot 121 transfers the wafer WF or the empty carrier C, the first robot 121 mounts the carrier C on the first recess 124.

Next a protocol is described for handling the carrier C and the wafer WF prior to creating the epitaxial film (hereafter referred to simply as "before-treatment") and after creating the epitaxial film (hereafter referred to simply as "after-treatment") in the vapor deposition device 1 according to the present embodiment. FIGS. 7 to 10 are schematic views illustrating a handling protocol for a wafer and a carrier in the vapor deposition device of the present embodiment and correspond to the wafer storage container 15 on one side of the device, the load-lock chamber 13, and the reaction furnace 11 in FIG. 1; a plurality of wafers W1, W2, W3, . . . (for example, a total of 25 wafers) are stored in the wafer storage container 15 and treatment is initiated in that order.

Figure 7:
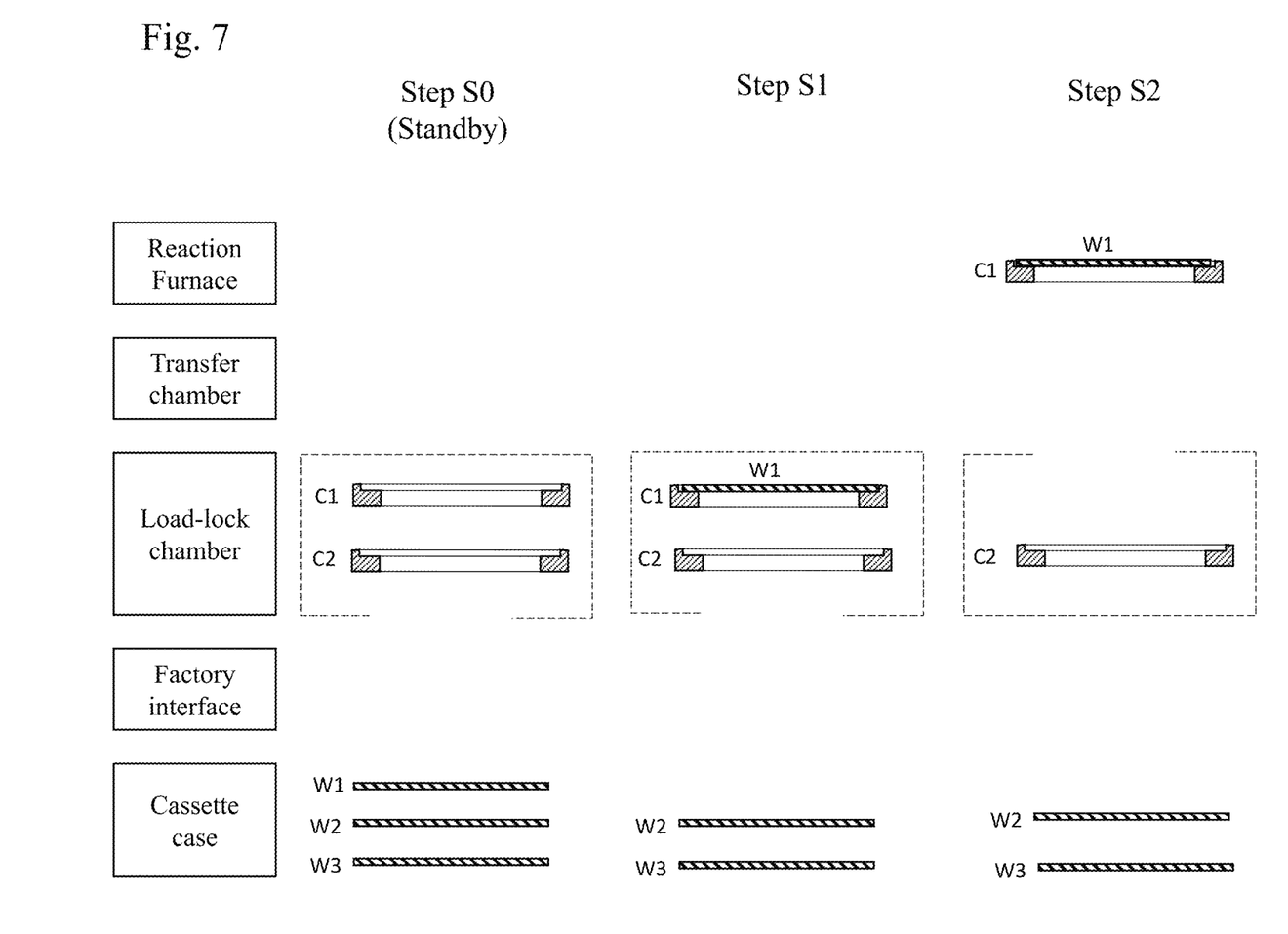
FIG. 7 is a diagram (no. 1) illustrating a handling protocol for the wafer and the carrier in the vapor deposition device of the embodiment.

Step S0 in FIG. 7 shows a standby state from which treatment using the vapor deposition device 1 is to begin, and has the plurality of wafers W1, W2, W3, . . . (for example, a total of 25 wafers) stored in the wafer storage container 15, has an empty carrier C1 supported by the first holder 172 of the load-lock chamber 13, has an empty carrier C2 supported by the second holder 173, and has an inert gas atmosphere in the load-lock chamber 13.

In the next step (step S1), the second robot 141 loads the wafer W1 that is stored in the wafer storage container 15 onto the second blade 143 and transfers the wafer W1 through the first door 131 of the load-lock chamber 13 to the carrier C1 that is supported by the first holder 172. The protocol for this transfer was described with reference to FIG. 4.

In the next step (step S2), the first door 131 of the load-lock chamber 13 is closed and, in a state where the second door 132 is also closed, the interior of the load-lock chamber 13 undergoes gas exchange to the inert gas atmosphere again. Then, the second door 132 is opened, the carrier C1 is loaded onto the first blade 123 of the first robot 121, the gate valve 114 of the reaction furnace 11 is opened, and the carrier C1 on which the wafer W1 is mounted is transferred through the gate valve 114 to the susceptor 112. The protocol for this transfer was described with reference to FIG. 4. In steps S2 to S4, the CVD film creation process is performed on the wafer W1 in the reaction furnace 11.

In other words, the carrier C1 on which the before-treatment wafer W1 is mounted is transferred to the susceptor 112 of the reaction chamber 111 and the gate valve 114 is closed, and after waiting a predetermined amount of time, the gas supply device 113 supplies hydrogen gas to the reaction chamber 111, giving the reaction chamber 111 a hydrogen gas atmosphere. Next, the wafer W1 in the reaction chamber 111 is heated to a predetermined temperature by the heat lamp and pretreatment such as etching or heat treatment is performed as necessary, after which the gas supply device 113 supplies raw material gas while controlling the flow volume and/or supply time. This creates a CVD film on the surface of the wafer W1. Once the CVD film is formed, the gas supply device 113 once again supplies the reaction chamber 111 with hydrogen gas and the reaction chamber undergoes gas exchange to a hydrogen gas atmosphere, after which the protocol stands by for a predetermined amount of time.

While the reaction furnace 11 is treating the wafer W1 in steps S2 to S4, the second robot 141 extracts the next wafer (W2) from the wafer storage container 15 and prepares for the next treatment. Prior to this, in step S3 in the present embodiment, the second door 132 of the load-lock chamber 13 is closed, and in a state where the first door 131 is also closed, the interior of the load-lock chamber 13 undergoes gas exchange to an inert gas atmosphere. Then, the second door 132 is opened, the carrier C2 supported by the second holder 173 is transferred to the first holder 172 by the first robot 121, and the second door 132 is closed. Subsequently, in step S4, the second robot 141 loads the wafer W2 that was stored in the wafer storage container 15 onto the second blade 143, the first door 131 is opened, and the wafer W2 is transferred to the carrier C2 that is supported by the first holder 172 of the load-lock chamber 13.

In this way, in the present embodiment, step S3 is added and the before-treatment wafer WF that was stored in the wafer storage container 15 is mounted on the first holder 172, which is the topmost-level holder of the holder 17 of the load-lock chamber 13. This is for the following reasons. Specifically, as illustrated in step S2, when the empty carrier C2 on which the next wafer W2 is to be mounted is supported by the second holder 173, once the wafer W2 is mounted on the carrier C2, there is a possibility that the carrier C1 mounting the after-treatment wafer W1 may be transferred to the first holder 172. The carrier C of the vapor deposition device 1 according to the present embodiment is transported to the reaction chamber 111, and therefore the carrier C is a factor in particle production, and when the carrier C1 is held above the before-treatment wafer W2, dust may fall on the before-treatment wafer W2. Therefore, step S3 is added and the empty carrier C2 is transferred to the first holder 172 so that the before-treatment wafer WF is mounted on the topmost-level holder (first holder 172) of the holder 17 of the load-lock chamber 13.

Figure 8:
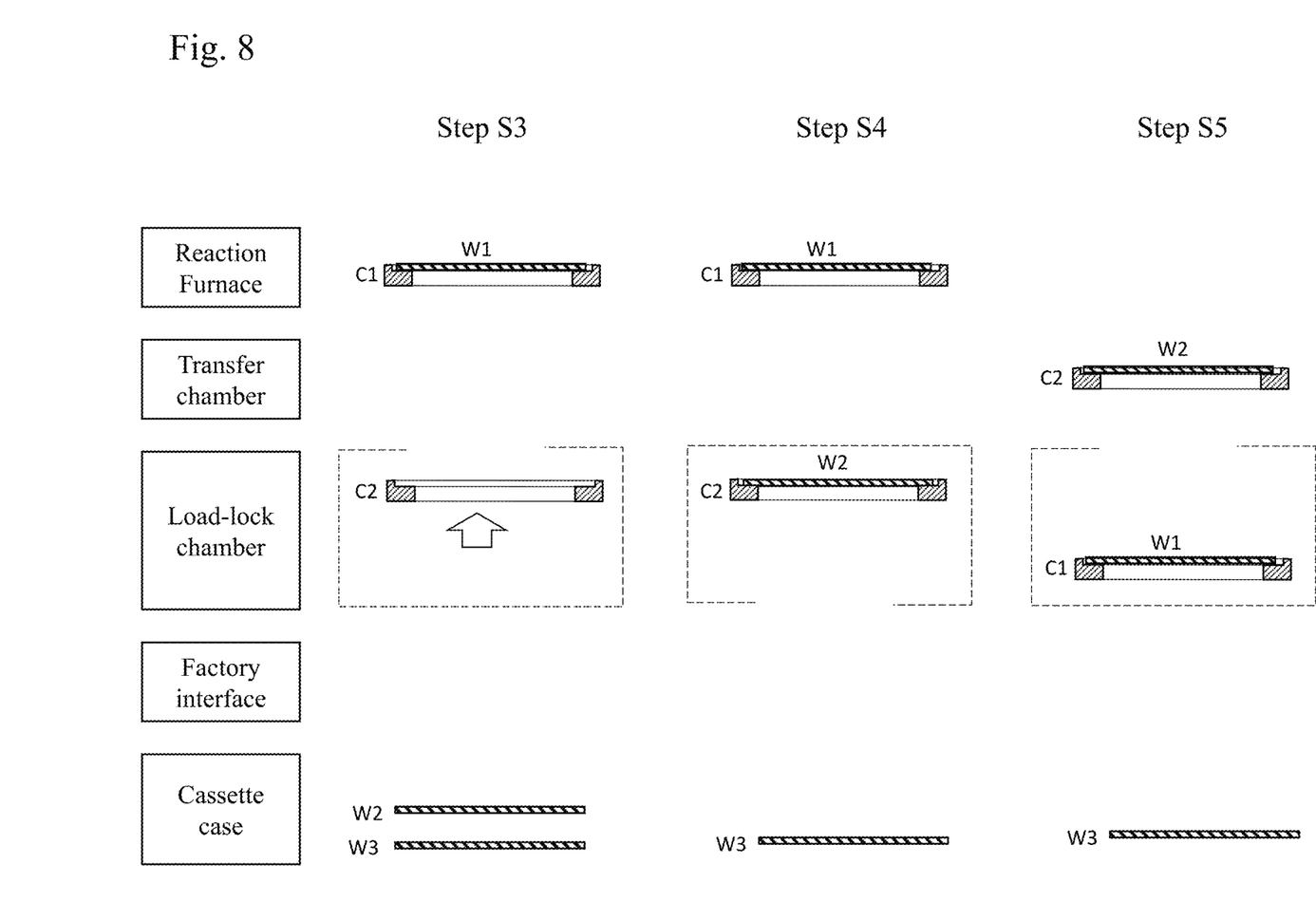
FIG. 8 is a diagram (no. 2) illustrating the handling protocol for the wafer and the carrier in the vapor deposition device of the embodiment.

In step S5, the first door 131 of the load-lock chamber 13 is closed and, in a state where the second door 132 is also closed, the interior of the load-lock chamber 13 undergoes gas exchange to an inert gas atmosphere. Then, the gate valve 114 of the reaction furnace 11 is opened, the first blade 123 of the first robot 121 is inserted into the reaction chamber 111 and is loaded with the carrier C1 on which the after-treatment wafer W1 is mounted, the carrier C1 is withdrawn from the reaction chamber 111, and the gate valve 114 is closed, after which the second door 132 is opened and the carrier C1 is transferred to the second holder 173 of the load-lock chamber 13. Subsequently, the carrier C2 supported by the first holder 172 is loaded onto the first blade 123 of the first robot 121 and, as illustrated in step S6, the gate valve 114 is opened and the carrier C2 on which the before-treatment wafer W2 is mounted is transferred through the wafer transfer chamber 12 to the susceptor 112 of the reaction furnace 11.

In steps S6 to S9, the CVD film creation process is performed on the wafer W2 in the reaction furnace 11. In other words, the carrier C2 on which the before-treatment wafer W2 is mounted is transferred to the susceptor 112 of the reaction chamber 111 and the gate valve 114 is closed, and after waiting a predetermined amount of time, the gas supply device 113 supplies hydrogen gas to the reaction chamber 111, giving the reaction chamber 111 a hydrogen gas atmosphere. Next, the wafer W2 in the reaction chamber 111 is heated to a predetermined temperature by the heat lamp and pretreatment such as etching or heat treatment is performed as necessary, after which the gas supply device 113 supplies raw material gas while controlling the flow volume and/or supply time. This creates a CVD film on the surface of the wafer W2. Once the CVD film is formed, the gas supply device 113 once again supplies the reaction chamber 111 with hydrogen gas and the reaction chamber 111 undergoes gas exchange to a hydrogen gas atmosphere, after which the protocol stands by for a predetermined amount of time.

Figure 9:
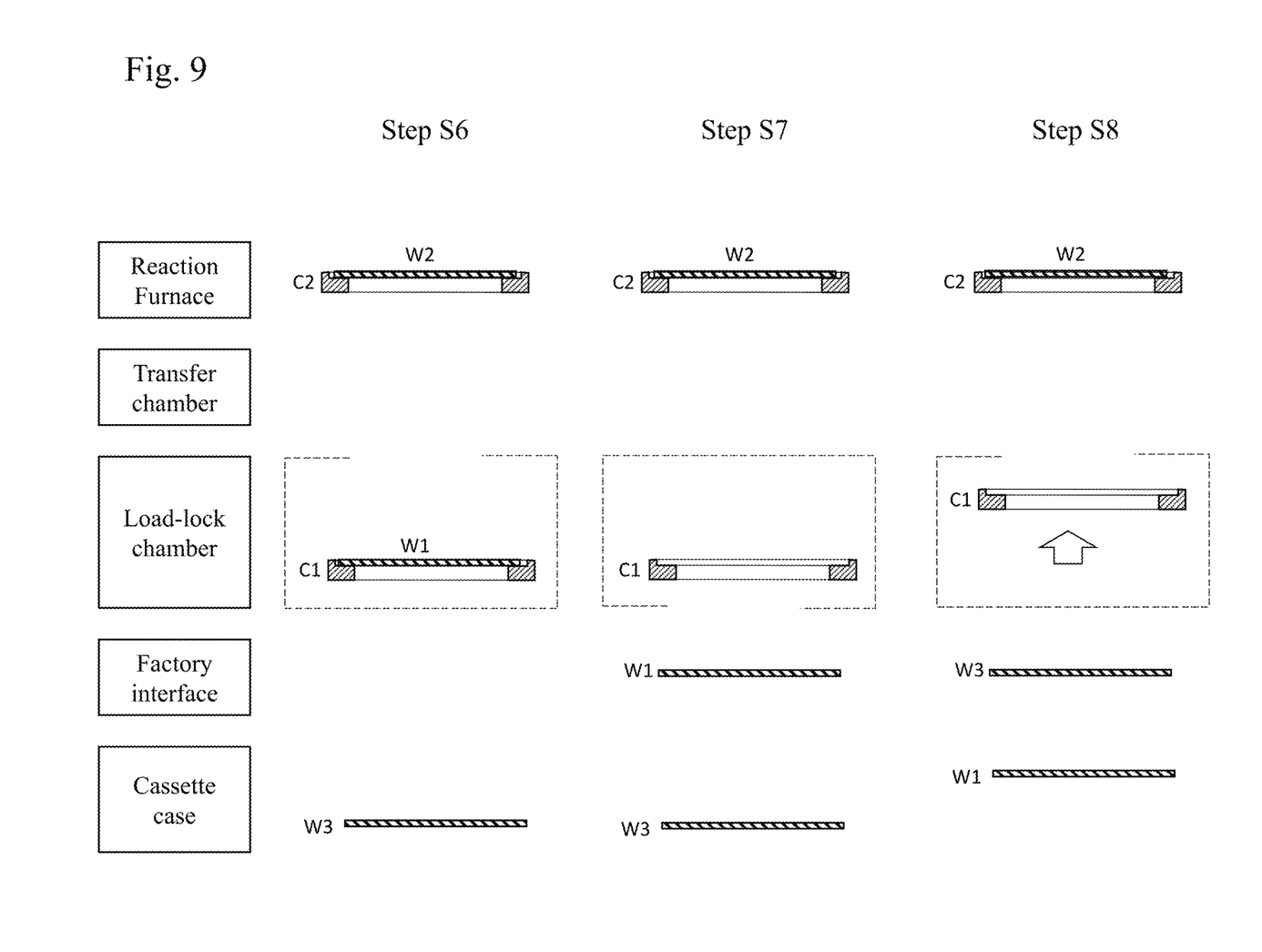
FIG. 9 is a diagram (no. 3) illustrating the handling protocol for the wafer and the carrier in the vapor deposition device of the embodiment.

In this way, while the reaction furnace 11 is treating the wafer W2 in steps S6 to S9, the second robot 141 stores the after-treatment wafer W1 in the wafer storage container 15 and also extracts the next wafer (W3) from the wafer storage container 15 and prepares for the next treatment. In other words, in step S7, the second door 132 of the load-lock chamber 13 is closed, and in a state where the first door 131 is also closed, the interior of the load-lock chamber 13 undergoes gas exchange to an inert gas atmosphere. Then, the first door 131 is opened, the second robot 141 loads the after-treatment wafer W1 onto the second blade 143 from the carrier C1 supported by the second holder 173 and, as illustrated in step S8, the after-treatment wafer W1 is stored in the wafer storage container 15. Subsequently, similarly to step S3 described above, in step S8, the first door 131 of the load-lock chamber 13 is closed, and in a state where the second door 132 is also closed, the interior of the load-lock chamber 13 undergoes gas exchange to an inert gas atmosphere. Then, the second door 132 is opened and the carrier C1 supported by the second holder 173 is transferred to the first holder 172 by the first robot 121.

Subsequently, in step S9, the second door 132 of the load-lock chamber 13 is closed, and in a state where the first door 131 is also closed, the interior of the load-lock chamber 13 undergoes gas exchange to an inert gas atmosphere. Then, the second robot 141 loads the wafer W3 that was stored in the wafer storage container 15 onto the second blade 143 and, as illustrated in step S9, the first door 131 is opened and the wafer W3 is transferred to the carrier C1 that is supported by the first holder 172 of the load-lock chamber 13.

Figure 10:
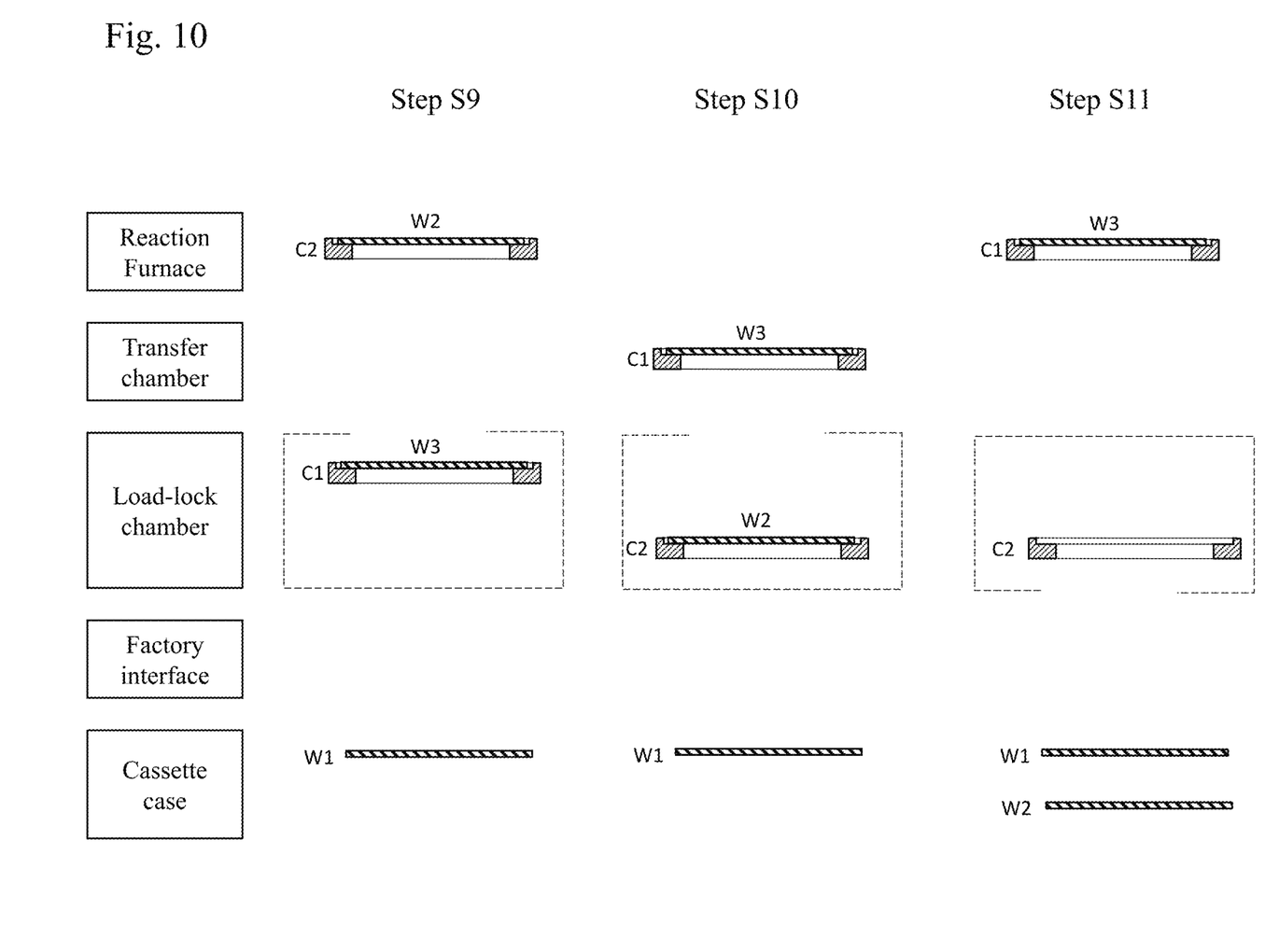
FIG. 10 is a diagram (no. 4) illustrating the handling protocol for the wafer and the carrier in the vapor deposition device of the embodiment.

In step S10, similarly to step S5 described above, the first door 131 of the load-lock chamber 13 is closed, and in a state where the second door 132 is also closed, the interior of the load-lock chamber 13 undergoes gas exchange to an inert gas atmosphere. Then, the gate valve 114 of the reaction furnace 11 is opened, the first blade 123 of the first robot 121 is inserted into the reaction chamber 111 and is loaded with the carrier C2 on which the after-treatment wafer W2 is mounted, and the gate valve 114 is closed, after which the second door 132 is opened and the carrier C2 is transferred from the reaction chamber 111 to the second holder 173 of the load-lock chamber 13. Subsequently, the carrier C1 supported by the first holder 172 is loaded onto the first blade 123 of the first robot 121 and, as illustrated in step S11, the carrier C1 on which the before-treatment wafer W3 is mounted is transferred through the wafer transfer chamber 12 to the susceptor 112 of the reaction furnace 11.

In step S10, similarly to step S7 described above, the second door 132 of the load-lock chamber 13 is closed, and in a state where the first door 131 is also closed, the interior of the load-lock chamber 13 undergoes gas exchange to an inert gas atmosphere. Then, the first door 131 is opened, the second robot 141 loads the post-treatment wafer W2 onto the second blade 143 from the carrier C2 that is supported on the second holder 173 and, as illustrated in step S11, the post-treatment wafer W2 is stored in the wafer storage container 15. Thereafter, the above steps are repeated until treatment for all of the before-treatment wafers WF stored in the wafer storage container 15 ends.

As described above, in the vapor deposition device 1 according to the present embodiment, while treatment is ongoing in the reaction furnace 11, the next before-treatment wafer WF is extracted from the wafer storage container 15 and prepared, the after-treatment wafer WF is stored in the wafer storage container 15, and the like, and so the amount of time consumed simply in transport is drastically reduced. In such a case, when a number of standby carriers C in the load lock chamber 13 is set to two or more, as with the holder 17 in the present embodiment, a degree of freedom in shortening the amount of time consumed simply in transport can be substantially increased.

When the number of the carriers C standing by in the load-lock chamber 13 is set to 3 or more, upon the carrier C1 on which the after-treatment wafer W1 is mounted being transferred to the load-lock chamber 13 in step S6, at least one empty carrier C on which no wafer WF is mounted is standing by in the load-lock chamber 13, Therefore, the empty carrier can be transferred to the topmost-level holder (first holder 172) of the holder 17 in the load-lock chamber 13 without going through the step S7 of withdrawing the after-treatment wafer W1 from the load lock-chamber 13. In this case, the after-treatment wafer W1 can be withdrawn from the load-lock chamber 13 in the step S9 of transferring the before-treatment wafer W3 to an empty carrier supported by the first holder 172. Therefore, it is not necessary to withdraw the after-treatment wafer W1 from the load-lock chamber 13 in order to transfer the empty carrier to the first holder 172 of the load lock-chamber 13, and the waiting time of the first robot 121 in the step S7 can be reduced. That is, the degree of freedom in shortening the amount of time consumed simply in transport can be substantially further increased.

Thus, when the space dedicated to the load-lock chamber 13 is considered, aligning the plurality of carriers C in multiple vertical levels reduces the space dedicated to the vapor deposition device 1 overall as compared to aligning the plurality of carriers C left-to-right. But, when the plurality of carriers C are aligned in multiple vertical levels, the carrier C may be held above a before-treatment wafer WF and dust may fall on the before-treatment wafer WF. However, in the vapor deposition device 1 according to the present embodiment, steps S3 and S8 are added and the empty carrier C2 is transferred to the first holder 172 so that the before-treatment wafer WF is mounted on the topmost-level holder (first holder 172) of the holder 17 of the load-lock chamber 13, and therefore the before-treatment wafer WF is mounted on the topmost-level carrier C. As a result, particles originating from the carrier C can be inhibited from adhering to the wafer WF and LPD quality can be improved.

DESCRIPTION OF REFERENCE NUMERALS

1 . . . Vapor deposition device
11 . . . Reaction furnace
111 . . . Reaction chamber
112 . . . Susceptor
113 . . . Gas supply device
114 . . . Gate valve
115 . . . Carrier lifting pin
12 . . . Wafer transfer chamber
121 . . . First robot
122 . . . First robot controller
123 . . . First blade
124 . . . First recess
13 . . . Load-lock chamber
131 . . . First door
132 . . . Second door
14 . . . Factory interface
141 . . . Second robot
142 . . . Second robot controller
143 . . . Second blade
15 . . . Wafer storage container
16 . . . Integrated controller
17 . . . Holder
171 . . . Holder base
172 . . . First holder
173 . . . Second holder
174 . . . Wafer lifting pin
C . . . Carrier
C11 . . . Bottom surface
C12 . . . Top surface
C13 . . . Outer circumferential wall surface
C14 . . . Inner circumferential wall surface
WF . . . Wafer

The invention claimed is:

1. A vapor deposition device comprising a plurality of robots configured to:
   transport a plurality of before-treatment wafers from a wafer storage container, through a factory interface, load-lock chamber, and wafer transfer chamber, to a reaction chamber in that order, and
   transport a plurality of after-treatment wafers from the reaction chamber, through the wafer transfer chamber, load-lock chamber, and factory interface, to the wafer storage container in that order, wherein:
   the load-lock chamber communicates with the factory interface via a first door and also communicates with the wafer transfer chamber via a second door,
   the wafer transfer chamber communicates, via a gate valve, with the reaction chamber in which a CVD film is formed on the wafer,
   the plurality of robots comprises a first robot provided with the wafer transfer chamber and a second robot provided with the factory interface,
   the vapor deposition device further comprises a plurality of ring-shaped carriers each which support an outer edge of a wafer,
   the first robot deposits a before-treatment wafer transported into the load-lock chamber into the reaction chamber in a state where the before-treatment wafer is mounted on a carrier of the plurality of carriers, and also withdraws an after-treatment wafer for which treatment in the reaction chamber has ended from the reaction chamber in a state where the after-treatment wafer is mounted on a carrier of the plurality of carriers and transports the wafer to the load-lock chamber,
   the second robot extracts a before-treatment wafer from the wafer storage container and mounts the wafer on a carrier of the plurality of carriers standing by in the load-lock chamber, and also stores in the wafer storage container an after-treatment wafer mounted on the carrier of the plurality of carriers that has been transported to the load-lock chamber,
   the load-lock chamber is provided with a first holder that supports a carrier of the plurality of carriers at a topmost-level and a second holder that supports a carrier of the plurality of carriers under the first holder, and
   the second robot mounts the before-treatment wafer extracted from the wafer storage container on the carrier of the plurality of carriers standing by at the first holder in the load-lock chamber.

2. The vapor deposition device according to claim 1, wherein the first robot transfers the carrier of the plurality of carriers supported by the second holder to the first holder when the first holder supports no carrier of the plurality of carriers upon the first robot mounting the before-treatment wafer extracted from the wafer storage container by the second robot on the carrier of the plurality of carriers standing by in the load-lock chamber.

3. The vapor deposition device according to claim 1, wherein the first robot withdraws the after-treatment wafer for which the treatment in the reaction chamber has ended from the reaction chamber in the state where the after-treatment wafer is mounted on the carrier of the plurality of carriers and transports the wafer to the second holder in the load-lock chamber.

4. The vapor deposition device according to claim 1, wherein the load-lock chamber is provided with a third holder that supports a carrier of the plurality of carriers under the second holder.

5. The vapor deposition device according to claim 1, wherein the first robot is provided with a first blade on which the carrier is mounted.

6. The vapor deposition device according to claim 5, wherein the first blade is provided with a recess corresponding to a part of an outer circumferential wall of surfaces of the plurality of carriers on an upper face.

7. The vapor deposition device according to claim 1, wherein the second robot is provided with a second blade on which the wafer is mounted.

8. The vapor deposition device according to claim 1, wherein the CVD film is a silicon epitaxial film.

9. A vapor deposition method using a vapor deposition device which is provided with a plurality of robots, the method comprising:
    transporting, via the plurality of robots, a plurality of before-treatment wafers from a wafer storage container, through a factory interface, load-lock chamber, and wafer transfer chamber, to a reaction chamber in that order, and
    transporting, via the plurality of robots, a plurality of after-treatment wafers from the reaction chamber, through the wafer transfer chamber, load-lock chamber, and factory interface, to the wafer storage container in that order, wherein:
    the load-lock chamber communicates with the factory interface via a first door and also communicates with the wafer transfer chamber via a second door,
    the wafer transfer chamber communicates, via a gate valve, with the reaction chamber in which a CVD film is formed on the wafer,
    the plurality of robots includes a first robot provided with the wafer transfer chamber and a second robot provided with the factory interface,
    the vapor deposition device further includes a plurality of ring-shaped carriers each which support an outer edge of a wafer,
    the first robot deposits a before-treatment wafer transported into the load-lock chamber into the reaction chamber in a state where the before-treatment wafer is mounted on a carrier of the plurality of carriers and also withdraws an after-treatment wafer for which treatment in the reaction chamber has ended from the reaction chamber in a state where the after-treatment wafer is mounted on a carrier of the plurality of carriers and transports the wafer to the load-lock chamber,
    second robot extracts a before-treatment wafer from the wafer storage container and mounts the wafer on a carrier of the plurality of carriers standing by in the load-lock chamber, and also stores in the wafer storage container an after-treatment wafer mounted on the carrier of the plurality of carriers that has been transported to the load-lock chamber,
    the load-lock chamber is provided with a first holder that supports a carrier of the plurality of carriers at a topmost-level and a second holder that supports a carrier of the plurality of carriers under the first holder,
    the second robot mounts the before-treatment wafer extracted from the wafer storage container on the carrier of the plurality of carriers standing by at the first holder in the load-lock chamber, and
    the first robot transfers the carrier of the plurality of carriers supported by the second holder to the first holder when the first holder supports no carrier of the plurality of carriers upon the first robot mounting the before-treatment wafer extracted from the wafer storage container by the second robot on the carrier of the plurality of carriers standing by in the load-lock chamber.

\* \* \* \* \*